United States Patent
Dean et al.

(10) Patent No.: US 7,706,856 B2
(45) Date of Patent: Apr. 27, 2010

(54) SYSTEM AND METHOD FOR PREDICTIVE THERMAL OUTPUT CONTROL OF A MEDICAL DEVICE

(75) Inventors: David E. Dean, Laurel, MD (US); Ariel Friedlander, Mequon, WI (US)

(73) Assignee: General Electric Company, Schenectady, NY (US)

( * ) Notice: Subject to any disclaimer, the term of this patent is extended or adjusted under 35 U.S.C. 154(b) by 1451 days.

(21) Appl. No.: 10/906,792

(22) Filed: Mar. 7, 2005

(65) Prior Publication Data
US 2005/0148845 A1    Jul. 7, 2005

Related U.S. Application Data

(63) Continuation-in-part of application No. 10/065,247, filed on Sep. 27, 2002, now Pat. No. 7,209,778.

(51) Int. Cl.
*A61B 5/05* (2006.01)
*G01V 3/00* (2006.01)
(52) U.S. Cl. .................. 600/410; 324/319; 324/318
(58) Field of Classification Search ............... 600/412, 600/474, 437; 324/318, 319
See application file for complete search history.

(56) References Cited

U.S. PATENT DOCUMENTS

| | | | | |
|---|---|---|---|---|
| 5,101,638 A | * | 4/1992 | White | 62/51.1 |
| 5,652,517 A | | 7/1997 | Maki et al. | |
| 5,906,614 A | * | 5/1999 | Stern et al. | 606/42 |
| 5,916,161 A | * | 6/1999 | Ishihara et al. | 600/410 |
| 6,229,311 B1 | * | 5/2001 | Abenaim | 324/322 |
| 6,239,680 B1 | * | 5/2001 | Nagano et al. | 335/296 |
| 6,270,463 B1 | * | 8/2001 | Morris et al. | 600/549 |
| 6,516,282 B2 | * | 2/2003 | Hedlund et al. | 702/132 |
| 6,777,939 B2 | | 8/2004 | Bechtold et al. | |
| 2002/0148604 A1 | | 10/2002 | Emeric et al. | |

FOREIGN PATENT DOCUMENTS

| | | | |
|---|---|---|---|
| JP | 10-43156 | * | 2/1998 |
| JP | 11-76195 | * | 3/1999 |

* cited by examiner

*Primary Examiner*—Eric F Winakur
*Assistant Examiner*—Helene Bor
(74) *Attorney, Agent, or Firm*—Ziolkowski Patent Solutions Group, SC

(57) ABSTRACT

A system and method for controlling thermal output of a medical device is disclosed. A thermal controller receives operational parameters for an impending use of a medical device and predicts a thermal output of the medical device from the operational parameters. The thermal controller compares the predicted thermal output to a desired limit on thermal output and, if the predicted thermal output exceeds the desired limit on thermal output, dynamically controls power consumption by the medical device to maintain an actual thermal output substantially at or below the desired limit on thermal output during use of the medical device.

21 Claims, 3 Drawing Sheets

SYSTEM AND METHOD FOR PREDICTIVE THERMAL OUTPUT CONTROL OF A MEDICAL DEVICE

CROSS-REFERENCE TO RELATED APPLICATIONS

The present application is a continuation-in-part and claims priority of U.S. patent application Ser. No. 10/065,247 filed Sep. 27, 2002, the disclosure of which is incorporated herein.

BACKGROUND OF THE INVENTION

The present invention relates generally to medical devices and, more particularly, to a system and method for predictively controlling thermal output of a magnetic resonance (MR) imaging device.

When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", MZ, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. That is, active electric coils are used to drive the spatial gradients into the static magnetic $B_0$ field. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

Some imaging processes demand higher amplitude gradient fields, faster field transitions, and greater duty cycles to improve image resolution, contrast, and scan time. These processes, often referred to as enhanced imaging processes, typically require more power than non-enhanced processes and result in higher thermal dissipation within the MR imaging device. As such, for a given enhanced imaging process, the resulting thermal output of the MR imaging device may exceed desirable limits and, thus, it may not be possible to acquire data using the given process. Or, in some systems, a given scan may be interrupted as a result of an undesirable thermal dissipation.

That is, some MR imaging devices have a bore temperature monitoring system (BTMS) to monitor the temperature inside the bore. Specifically, the BTMS halts operation of the MR imaging device if a temperature in the bore has surpassed a desired level or limit. As such, the BTMS dynamically interrupts the scan to allow the temperature in and around the MR imaging device and, specifically, the bore, to decrease to the desirable level.

Relying solely on a BTMS to regulate the imaging process has some drawbacks. For example, a BTMS is a reactionary tool that only halts a given scan after bore temperature exceeds a given threshold. Furthermore, periodically halting operation of the MR imaging device to allow the bore temperature to drop injects undesirable delays into scheduled imaging processes and, as a result, increases scan time and negatively affects throughput. Accordingly, systems have been developed to avoid repeated engagement of the BTMS by setting a constant limit on a basic operating parameter of the MR imaging device, for example, coil current. That is, some MR imaging devices include software to limit temperatures by holding the root-mean-square (RMS) current levels used to generate the gradient fields to a predefined value.

Accordingly, these systems preclude prescription of enhanced imaging processes that would cause temperature levels to rise above desirable limits. However, by fixing the peak power supplied to a coil, these systems ignore the temporal response of the specific MR imaging device. That is, these systems, which employ hard limits, rely on assumptions concerning the use profile and boundary conditions of the MR imaging device and do not consider the actual thermal output of the MR device for a particular imaging process. Further, the assumptions concerning the use profile and boundary conditions of the MR imaging device are generally conservative so as to ensure that the MR imaging device is not driven to produce excessive temperatures.

As such, these predefined hard thresholds often limit the MR imaging device from performing many processes that the MR imaging device is otherwise capable of executing without producing excessive temperatures. That is, the MR imaging device is often conservatively controlled to not execute a given scan notwithstanding that the resulting thermal output would still remain below thermal limits. Specifically, because these predefined hard limits are based on quantities such as gradient current or power, they do not consider the actual temperatures in and around the MR imaging device, the frequency of the desired imaging process, the axes selection included in the desired imaging process, or the specific coils employed during the desired imaging process. Accordingly, the predefined limits, such as current limits, often restrict an operator from utilizing enhanced, or more aggressive, scanning procedures even through the associated temperatures would remain within acceptable limits. As a result, the diagnostic capability of the MR imaging is unnecessarily restricted.

It would therefore be desirable to have a system and method capable of dynamically controlling thermal output of a medical device. In particular, it would be desirable to have a system and method capable of predicting a thermal output of a medical device based on particulars of an impending use of the device and dynamically controlling the medical device substantially consistent with the particulars while maintaining the thermal output of the medical device within a desired temperature range. It would also be desirable to have a method and system to control power to coils of an MR device during execution of an enhanced imaging process without driving a bore temperature to a level in excess of a given value.

BRIEF DESCRIPTION OF THE INVENTION

The present invention provides a system and method for predictively controlling thermal output of a medical device. The thermal output of the medical device is predicted based on desired operational parameters. Power consumption of the medical device during use thereof is dynamically controlled to maintain an actual thermal output of the medical device within desired thermal limits. The invention is particularly advantageous for enhanced uses of the medical device where greater power consumption is typically experienced. The present invention also advantageously reduces power consumption of the device to permit implementation of enhanced protocols.

In accordance with one aspect of the invention, a thermal controller is disclosed that is configured to receive operational parameters for an impending use of a medical device and predict a thermal output of the medical device from the operational parameters. The thermal controller is further configured to compare the predicted thermal output to a desired limit on thermal output and, if the predicted thermal output exceeds the desired limit on thermal output, dynamically control power consumption by the medical device to maintain an actual thermal output substantially at or below the desired limit on thermal output during use of the medical device.

In accordance with another aspect, the invention includes a computer readable storage medium having a computer program stored thereon and representing a set of instructions that when executed by a computer of a medical imaging device, causes the computer to receive desired operational constraints for a scan to be performed with the medical imaging device from a user-input. The instructions further cause the computer to determine a potential thermal output of at least one heat-generating component of the medical imaging device from the desired operating constraints and a power to be delivered to the at least one heat-generating component during the scan. The computer is also caused to determine if the potential thermal output will cause an actual thermal output to surpass a desired limit on thermal output during the scan and, if the potential thermal output will cause the actual thermal output to surpass the desired limit on thermal output during the scan, adjust the power to be delivered to the at least one heat-generating component during the scan to substantially maintain the actual thermal output at or below the desired limit on thermal output when performing the scan according to the desired operating constraints.

According to another aspect of the invention, an MR imaging apparatus is disclosed that includes a plurality of gradient coils positioned about a bore of a magnet to impress a polarizing magnetic field, and an RF transceiver system and an RF switch controlled by a pulse module to transmit RF signals to an RF coil assembly to acquire MR images. The MR imaging apparatus also includes an operator console configured to receive operational characteristics of a desired imaging process and a computer. The computer is programmed to receive the operational characteristics of an impending MR scan from the operator console, determine a power delivery level to execute the impending MR scan according to the operational characteristics, and predict a thermal output to the bore of the magnet from the operational characteristics of the determined power delivery level. The computer is also programmed to predict a thermal output to the bore of the magnet to determine a predicted bore temperature, compare the predicted bore temperature to a desired limit threshold temperature, and, if the predicted bore temperature exceeds the desired threshold bore temperature, adjust the determined power delivery level to lower the predicted bore temperature.

Various other features and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
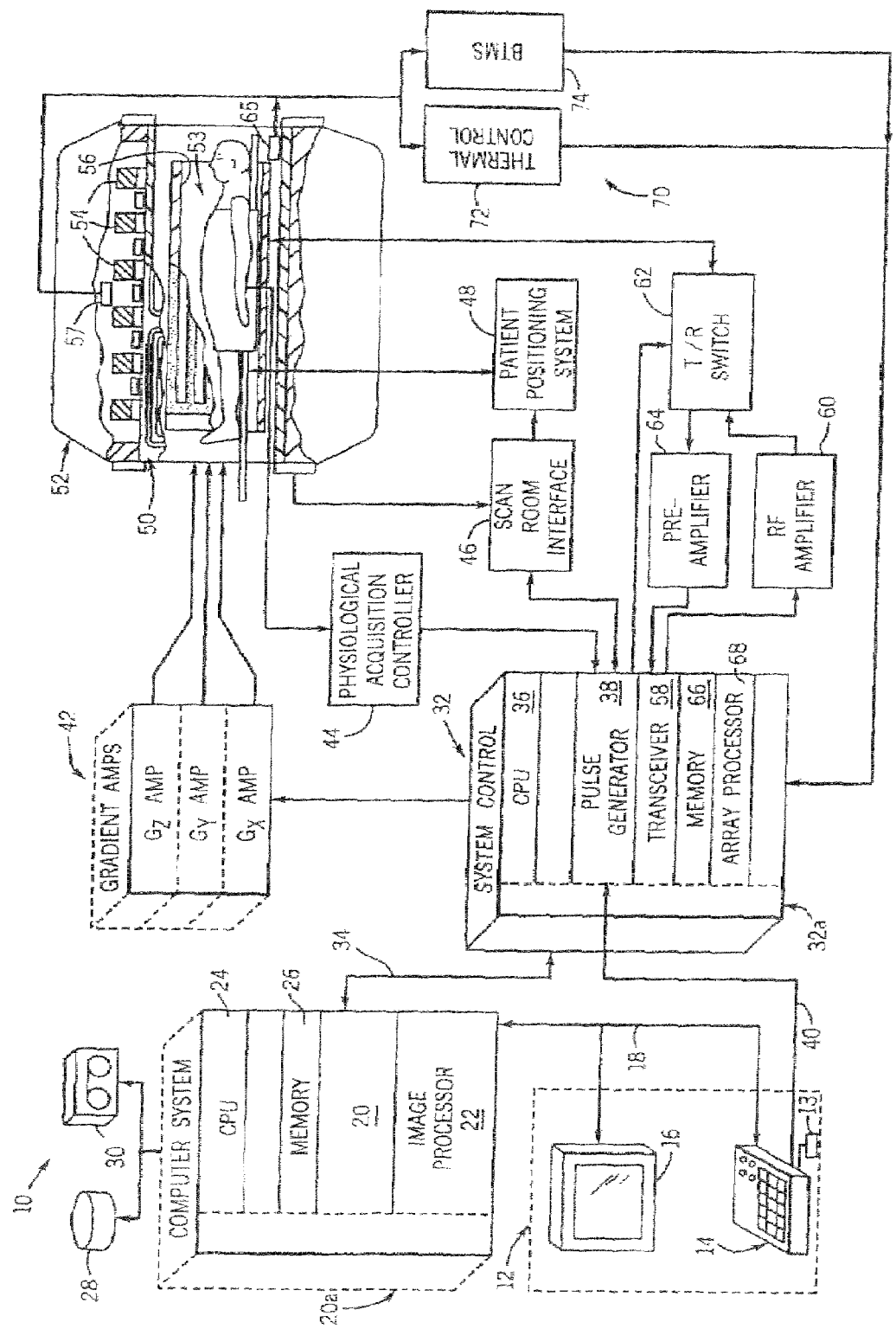
FIG. 1 is a schematic block diagram of an MR imaging system including the present invention.

Referring to FIG. 1, the major components of an MR imaging system 10 incorporating the present invention are shown. The operation of the system is controlled from an operator console or user input 12 which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence and parameters thereof that is to be performed. The pulse generator module 38 operates the system components to carry out the desired scan sequence having the desired parameter to produce data that indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. Additionally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 that surrounds a bore 53 and which may include a superconducting magnet 54 and/or a whole-body RF coil 56. It is contemplated that magnet assembly 52 may include a cryostat and a cryocooler to cool the superconducting magnet 54. While such cryocooler systems cool the superconducting magnet 54, the gradient coil assembly 50 does generate heat that increases the temperature of the bore 53. Therefore, one or more temperature sensors 57 are disposed in or about the gradient coil assembly 50 and are configured to communicate feedback indicating temperatures in or about the gradient coil assembly 50 that, as will be described, are used to control the temperature in the bore 53.

A transceiver module 58 in the system control 32 produces pulses which are amplified by an RF amplifier 60 and coupled to the RF coil or antenna 56 by a transmit/receive switch 62. Additionally, the MRI system may include an RF shield or RF shielding configured about the bore 53 to shield against extraneous RF signals. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode. Additionally, as will be described, one or more temperature sensors 65 are disposed in or about the RF coil 56 and associated components and are configured to communicate feedback indicating temperatures in or about the RF coil 56 and associated components.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

As will be described in detail with respect to FIG. 2, the MR system 10 includes a thermal controller or thermal control system 70. The thermal control system 70 includes a thermal controller 72 and, optionally, a bore temperature monitoring system (BTMS) 74. The thermal control system 70 is configured to receive temperature feedback from the temperature sensors 57, 65, interpret the feedback, and communicate thermal control instructions to the system control 32. As will be described, the thermal control system 70 and, more particularly, the thermal controller 72, is configured to predict a thermal output of the MR system 10 and, more particularly, a temperature in the bore 53, based on desired operational parameters input by a user via the operator console 12 or otherwise determined. Utilizing this predicted thermal output, the thermal control system 70, and more particularly, the thermal controller 72, is configured to dynamically control operational power of an impending scan while conforming to the operational parameters in order to maintain a desirable thermal output of the MR system 10 to, in turn, maintain a desirable temperature range within the bore 53.

Figure 2:
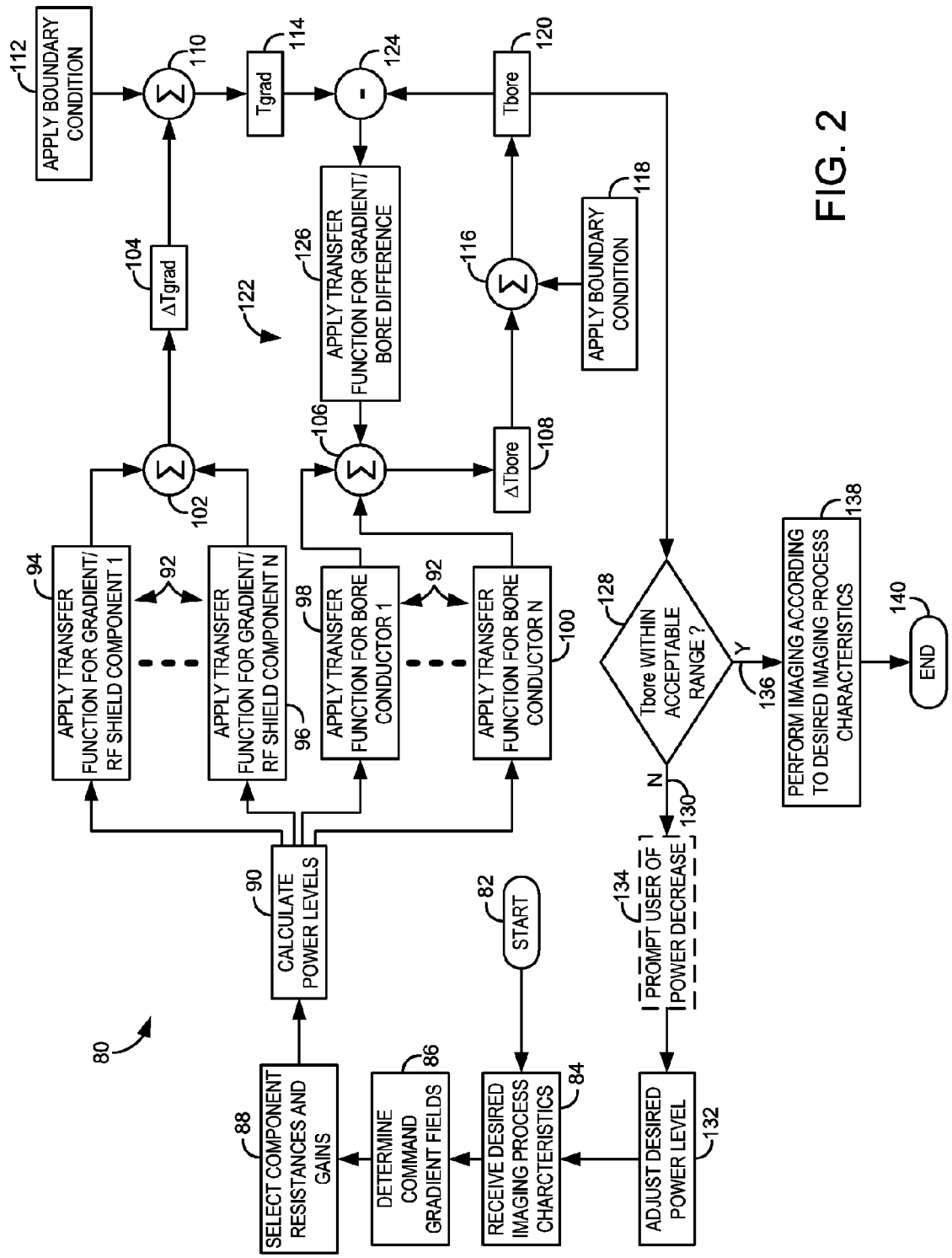
FIG. 2 is a flow chart setting forth the steps of a process for controlling thermal output of an MR imaging system of in accordance with the present invention.

Referring now to FIG. 2, a flow chart setting forth the steps of a process 80 for controlling the thermal output of an MR imaging system is shown. The process 80 starts 82 upon receiving desired imaging process characteristics 84. It is contemplated that the desired imaging process characteristics or constraints 84 include properties selected by an operator, such as those entered via operator console 12 of FIG. 1, or properties derived from operator selections. For example, the imaging process characteristics 84 may include the type of imaging process desired (i.e. 2D, 3D, fast spin echo, and the like), slice selection image resolution, repetition time (TR), image axis (axial, coronal, sagittal, or oblique), gradient coils to be activated to encode a field-of-view (FOV) and/or weight and size of the subject to be imaged.

From the desired imaging process characteristics, command gradient fields 86, ($G_x$, $G_y$, and $G_z$, typically measured in Gauss/cm) are determined. Accordingly, unlike traditional thermal limiting systems that employ a predetermined hard limit, the process 80 preferably adjusts the command gradient fields 86 to maintain system outputs, for example, bore temperature, specific absorption rate (SAR), and the like, within desirable limits without changing the process characteristics input by the user or otherwise determined.

The process 80 determines resistance and gain values specific to the particular components of the imaging device 88. Specifically, the gain values (typically measured in Amps per G/cm) are preloaded for each coil set ($G_x$, $G_y$, and $G_z$) and the electrical resistances (R) are preloaded as a set of curves ($\Delta R$ vs. frequency) stored in memory and representing the effective resistance of each physical conductor. For example, the preloaded set of curves may include $\Delta R$ vs. frequency data for the gradient coils ($G_x$, $G_y$, and $G_z$ for inner & outer coils), any RF shielding, and the RF coil. It is contemplated that these $\Delta R$ vs. frequency curves may be acquired from impedance sweep data acquired during each stage of device or component assembly. More particularly, transient gradient fields are multiplied by appropriate gain values to quantify transient current levels in each coil. The resulting waveforms can be transformed to the frequency domain with a Fast Fourier transfer (FFT) to quantify the RMS current levels in each coil for each time period when each coil is energized. Additionally, the $\Delta R$ vs. frequency curves provide the effective resistance for each Fourier component of current magnitude and thus, as will be described, allow the prediction of total heat load in each conductor whenever a gradient coil is energized.

Accordingly, the desired power levels 90 attributable to the desired imaging process characteristics 84 and command gradient fields 86 when applied to the specific resistances and gains of the components of the imaging device 88 can be determined. As will be described, each component of the imaging device, as represented by their respective resistances and gains, forms a heat load when the desired power levels 90 are applied thereto. Furthermore, as will be described, the specific heat output from each heat-generating component, i.e. heat load, can be accurately predicted using a plurality of transfer functions 92.

Specifically, power applied to a heat-generating component contributes to an actual temperature rise in the component. As such, a corresponding transfer function that is predefined with values that are particular to the component and heat source can be used to predict thermal characteristics of the component when power is applied thereto. In a preferred embodiment, a unique transfer function is defined for each heat-generating component. As such, temperature rises can be determined uniquely for each heat-generating component. Accordingly, in a preferred embodiment, a plurality of transfer functions 92 are used to predict temperature rises across multiple locations.

For example, one transfer function may convert the heat load from the inner $G_z$ coil to a temperature rise in the upper area of a gradient coil assembly at a location designated as Z=0. Therefore, this specific transfer function may be used to predict the actual temperature rise of the gradient coil assembly at the Z=0 location over multiple scan protocols. Similarly, a transfer function may be defined and used to predictably determine the thermal output of any heat-generating component at any position without requiring the transfer function to be tailored to a specific scan protocol.

According to one embodiment, the plurality of transfer functions 92 includes transfer functions 94, 96 having values designed to correspond to conductors that reside within the gradient coil assembly 50 of FIG. 1 and/or any RF shield. Additionally, the plurality of transfer functions 92 includes transfer functions 98, 100 having values designed to correspond to all conductors in the patient bore, for example, the RF coil 56 of FIG. 1.

As the location where temperature information is needed is dependent upon the operating temperature profile of the particular MR scanner model, it is contemplated that the plurality of transfer functions 92 may be tailored to include values specific to a particular model or device. Additionally, as will be described, it is contemplated that the system may be designed to dynamically adjust the transfer functions to adapt generalized transfer functions to device-specific transfer functions over time.

With respect to the individual transfer functions 94-100, it is contemplated that the transfer functions may be linear first order transfer functions that are mathematical representations modeling the temporal response of the heating of solid objects. That is, each transfer function utilizes a single heat load (q, typically measured in Watts) to generate a single value that is the change in temperature ($\Delta T$, usually measured in degrees Celsius) resulting from q. Thus, any defined heat load q, which will generally vary in time, may be used to predict the resulting temperature change $\Delta T$, which also varies in time. This mathematical relationship may be reduced to require two properties of the object to be quantified as values. Specifically, a value "A" represents the value that $\Delta T$ changes after prolonged exposure to a constant heat load of unit value and a value "$\tau$" that represents the time constant which defines how quickly $\Delta T$ changes to variations in q. Additionally, a value "s" represents a mathematical transformation of the temporal characteristics of the heat load q. According, the linear first order transfer function can be represented as follows:

$$\frac{A}{\tau \times s + 1}.$$ Eqn. 1

The above-described linear first order transfer function transforms one input, q, to one output, $\Delta T$. However, this transfer function is just one of many mathematical formats that can be used to predict the thermal response of a component or location in response to a particular desired operation. Accordingly, it is contemplated that other forms of transfer functions may be equivalently utilized, such as the differential equation form of Eqn. 1 shown as follows:

$$mc\frac{dT}{dt} = q - \frac{\Delta T}{R};$$ Eqn. 2 where "m" is the object mass, "c" is the specific heat of object, "dT/dt" is the temporal rate of change of the object temperature, "q" is the heat load into the object, "$\Delta T$" is the difference between the object temperature and the temperature of its surroundings, and "R" quantifies the sensitivity of heat transfer between the object and its surroundings. As such, Eqn. 1 and Eqn. 2 relate as follows:

$$A = R$$ Eqn. 3; and $$\tau = mcR$$ Eqn. 4.

Referring again to FIG. 2, for any specific location, the net temperature rise is the sum of the outputs from the corresponding transfer functions 92 for all heat loads. Therefore, a sum 102 of the outputs of the transfer functions specific to the gradient coils and RF shield 94, 96 yields $\Delta T$grad 104. Similarly, a sum 106 of the outputs of the transfer functions specific to the bore 98, 100 yields $\Delta T$bore 108. Therefore, the net temperature change at any location, for example, the gradient coil locality and the bore locality, is the sum of the outputs from the transfer functions representing those localities. As such, $\Delta T$grad 104 represents direct heating from currents in the gradient coils and $\Delta T$bore 108 represents direct heating from currents in the RF antenna when a gradient coil is energized plus heat transfer with the gradient coil due to temperature differences therewith. Additionally, it is noted that $\Delta T$grad does not necessarily include that same heat transfer with the RF antenna because, while those levels can drive temperatures of the patient bore, the heat transfer is typically insignificant to net heating of the much larger gradient coil. While, for exemplary purposes, net temperature rises for only the gradient coil locality and the bore locality are determined, it is contemplated that net temperature rises for virtually any locality may be readily included.

The net temperature rise for the gradient coil locality, $\Delta T$grad 104, is then summed 110 with appropriate boundary condition data 112 received from temperature sensors disposed about the locality, such as temperature sensors 57, 67 of FIG. 1. Specifically, one or more temperature sensors are included to report the boundary conditions for the gradient coil and/or coolant inlet (liquid and gas). This boundary condition data 112 is combined with the $\Delta T$grad prediction 104 to predict temperature values for the gradient coil locality. Therefore, the result of the summation 110 is the predicted temperature of the gradient coil locality, Tgrad 114.

Similarly, the net temperature rise for the bore conductor locality, $\Delta T$bore 108, can be summed 116 with appropriate boundary condition data 118 received from temperature sensors disposed about the locality, such as temperature sensors 57, 65 of FIG. 1. Specifically, one or more temperature sensors are included to report the boundary condition for the bore, which may include ambient air temperature and, should a bore blower system (not shown) be included, air velocity. This boundary condition data 118 is combined with the $\Delta T$bore 108 predictions to predict temperature values in the bore. Therefore, the result of the summation 116 is the predicted temperature of the bore conductor locality, Tbore 120.

In accordance with one embodiment, to increase the accuracy of the determination of Tbore 120, a differential feedback loop 122 is employed. Accordingly, Tgrad 114 and Tbore 120 are subtracted 124 and this difference is applied to another transfer function for the Tgrad/Tbore difference 126. The output of the differential feedback loop is then included in the summation 106 to determine $\Delta T$bore 108.

Once Tbore 120 is determined, a check is made to determine if Tbore is within an acceptable temperature range 128. If Tbore 120 is not within the acceptable range 130, the desired power level 132 is automatically adjusted. Specifically, if the bore temperature, Tbore 120, is predicted to rise above desired threshold or limit on temperature levels during the commanded scan, then the gradient waveforms are automatically adjusted to lower the power levels 132 while remaining consistent with the originally prescribed parameters or characteristics of the desired imaging process 84.

Additionally, it is contemplated that a user prompt may, optionally, be included to notify the operator 134 that the bore temperature 120 would exceed acceptable levels during the prescribed scan at the initially determined power levels and, as such, the power levels are should be or have been adjusted 132. While not only effective in advising the user that data is to be acquired at reduced power levels, providing the aforementioned prompt may also be used to assist the user in prescribing future scans or planning each workday's patient schedule. Moreover, the prompt gives the user the opportunity to halt the scan at the reduced power levels if the highest possible power levels are critical. As such, the user can allow the measured temperatures to fall before scanning.

Once the power levels are adjusted 132, the process 80 reiterates to recheck the predicted bore temperature with the adjusted power 132. Therefore, the process 80 continues until the predicted Tbore 120 is within the acceptable range 136. Once the predicted Tbore 120 is within the acceptable range 136, imaging is performed, if necessary, at a reduced power, according to the desired imaging process characteristics 138 and process 80 ends at 140.

The above-described process reduces errors associated with systems that limit the RMS level of composite gradient current regardless of any actual temperatures, frequency content, or axes selection. Accordingly, the process reduces the probability of carrying out a scan with resulting temperatures in excess of desirable limits. Additionally, the removal of artificial current limits facilitates more aggressive or enhanced scanning as long as previous imaging processes and present boundary conditions have not raised the bore temperature above an acceptable temperature. Therefore, the above-described process provides improved control of gradient power, maintains temperatures within a desired range, and increases overall scanner performance and efficiency.

Figure 3:
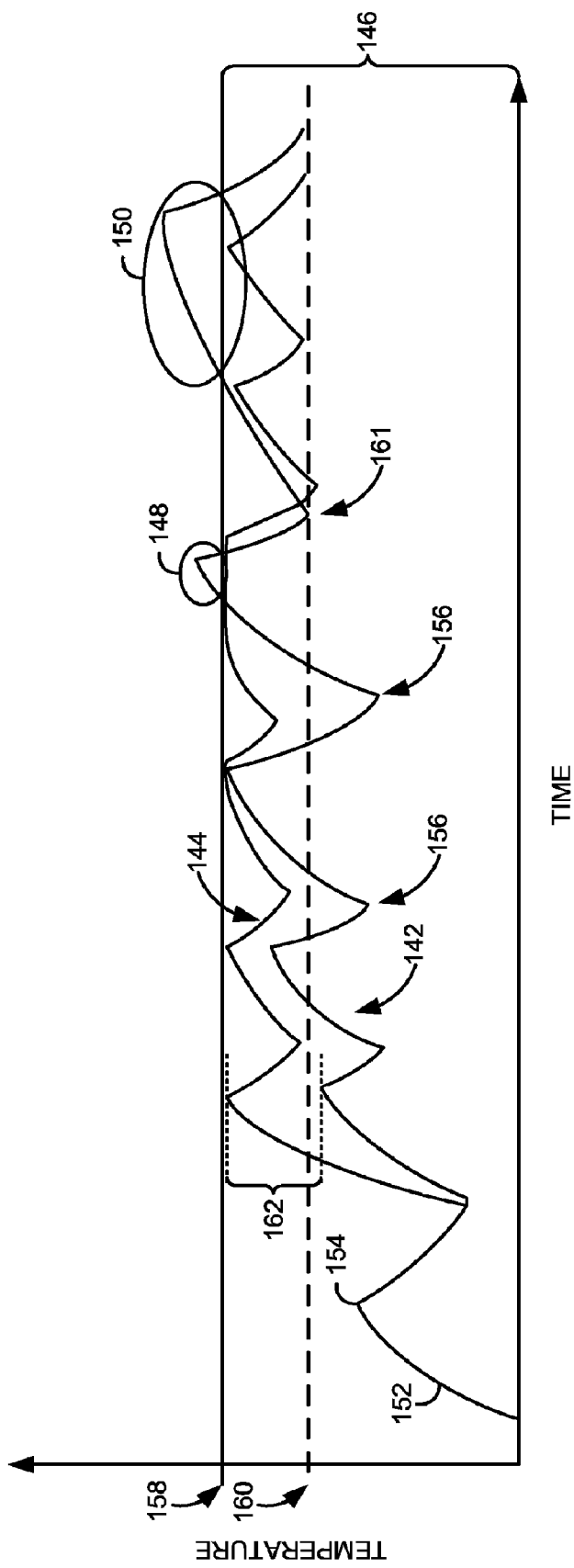
FIG. 3 is a graph showing temperature output during various imaging processes with and without the thermal output control of the present invention.

Referring now to FIG. 3, a graph is shown qualitatively illustrating the difference between the thermal output of traditional hard limited current-based temperature controlling system 142 and the thermal output of an exemplary system that operates according to the above-described process 144. While similar increases in performance and efficiency will be experienced during conventional scanning operations, to better highlight the advantages of the present invention, FIG. 3 compares the thermal output of both systems 142, 144 during enhanced imaging procedures.

Specifically, FIG. 3 shows a thermal output of a traditional thermal control system employing hard limited RMS current thresholds to control temperature 142 over a time period. Additionally, FIG. 3 shows a thermal output of a system employing the above-described thermal control technique 144 of the present invention over time. In system 142, halts due to the thermal output surpassing the acceptable temperature range 146 occur repeatedly 148, 150 as the duration of scanner use is increased. That is, when system 142 begins scanning, the system is at a relatively cool temperature 152. However, as scanning procedures continue, the temperature increases 154. While the system is permitted to cool during period 156, if sufficient cooling does not occur, the temperature increases are compounded until the thermal output surpasses 148, 150 the maximum desirable temperature threshold 158. In this case, once the maximum desirable temperature threshold 158 is surpassed 148, the BTMS engages and requires the system to discontinue use until the system cools to a minimum acceptable cool temperature 160. As such, a prescribed scan may be interrupted due to the BTMS enforcing an unscheduled shutdown of the MR system 142 to allow for MR system cooling 161.

To compound this problem, even though MR system 142 cools toward the minimum acceptable cool temperature 160, the subsequently prescribed scan may still cause thermal output to exceed 150 the maximum desirable temperature threshold 158 and the BTMS again engages and forces the MR system 142 to discontinue use until it has cooled to the minimum acceptable cool temperature 160. That is, it may be required that the MR system undergo a full cooling to the minimum temperature 160 before the scan is completed or a subsequent scan is permitted. Thus, a great lag in scan time is enforced for repeated enhanced scans.

In contrast, system 144 is configured to control thermal output according to the present invention. As such, repetitive enhanced scanning processes will be permitted without exceeding the maximum desirable temperature threshold 158. That is, system 144 allows for significant increases in thermal output over conventional systems 142 as shown by its tolerance 162 for increased thermal output associated with high power consumption of repetitive enhanced imaging processes. Additionally, though the temperature about system 144 may approach the maximum acceptable temperature threshold 158, by dynamically adjusting the power applied to the gradient coils to allow adequate cool-down, the temperature does not surpass the maximum desirable temperature threshold 158. According, the BTMS is not engaged and thermal shut-downs are avoided while scans having increased speed and resolution are repetitively achieved. As such, the probability of a bore temperature in excess of a maximum desirable temperature threshold 158 is reduced. While adjusting power applied to the gradient coils may have an impact on contrast or resolution, the time-consuming delays and halts are avoided.

In accordance with a preferred embodiment of the invention, a BTMS is used for additional protection against excess bore temperatures. Therefore, the accuracy of predicted bore temperatures and adjusted power levels may be checked against the data acquired and the operation of the BTMS since, over significant periods of time, sequential use of the transfer functions may cause an accumulation of prediction error. However, it is recognized that the present invention advantageously reduces the frequency when the BTMS is activated.

Additionally, by including the BTMS, information from the BTMS may be utilized to adjust the preloaded values for A and $\tau$, of Eqns. 1, 3, and 4, as scan experience is accumulated for a particular system. Those adjustments can be used to incrementally and dynamically decrease the differences between measured and predicted temperatures and, thus, substantially improve the accuracy of the preloaded values for a particular scanner compared to the preloaded values which must represent the statistical extremes of any scanner in the installed base.

However, it is also contemplated that the above-described thermal control technique may be utilized with systems that do not include a BTMS. In this case, the above-described thermal control technique not only controls thermal output but also provides thermal protection.

In summary, the present invention includes a control system configured to set dynamic limits on the power injected into the gradient coils. That dynamic limit will be determined for each commanded prescription as a function of the initial thermal and boundary conditions. This is accomplished through use of a thermal predictor module which provides a computational algorithm to model a series of coupled first order dynamic subsystems designed to simulate the actual thermal characteristics of the localities/components within the medical device. Therefore, the present invention uses thermal boundary and initial condition data with a prediction algorithm to dynamically set limits on the electrical power supplied to the gradient coils. This temporally predictive technique generally allows much higher power levels than those which employ a fixed limit on gradient current. Additionally, whenever energetic scanner use has caused high temperatures, the present invention automatically adjusts the input power so as to avoid an over-limit condition and its resulting sudden halt to scanning processes.

Therefore, the present invention includes a thermal controller that is configured to receive operational parameters for an impending use of a medical device and predict a thermal output of the medical device from the operational parameters. The thermal controller is further configured to compare the predicted thermal output to a desired limit on thermal output and, if the predicted thermal output exceeds the desired limit on thermal output, dynamically control power consumption by the medical device to maintain an actual thermal output substantially at or below the desired limit on thermal output during use of the medical device.

A computer readable storage medium having a computer program stored thereon and representing a set of instructions that when executed by a computer of a medical imaging device causes the computer to receive desired operational constraints for a scan to be performed with the medical imaging device from a user-input. The instructions further cause the computer to determine a potential thermal output of at least one heat-generating component of the medical imaging device from the desired operating constraints and a power to be delivered to the at least one heat-generating component during the scan. The computer is also caused to determine if the potential thermal output will cause an actual thermal output to surpass a desired limit on thermal output during the scan and, if the potential thermal output will cause the actual thermal output to surpass the desired limit on thermal output during the scan, adjust the power to be delivered to the at least one heat-generating component during the scan to substantially maintain the actual thermal output at or below the desired limit on thermal output when performing the scan according to the desired operating constraints.

An alternate embodiment of the present invention includes an MR imaging apparatus having a plurality of gradient coils positioned about a bore of a magnet to impress a polarizing magnetic field, and an RF transceiver system and an RF switch controlled by a pulse module to transmit RF signals to an RF coil assembly to acquire MR images. The MR imaging apparatus also includes an operator console configured to receive operational characteristics of a desired imaging process and a computer. The computer is programmed to receive the operational characteristics of an impending MR scan from the operator console, determine a power delivery level to execute the impending MR scan according to the operational characteristics, and predict a thermal output to the bore of the magnet from the operational characteristics and the determined power delivery level. The computer is also programmed to predict a thermal output to the bore of the magnet to determine a predicted bore temperature, compare the predicted bore temperature to a desired threshold bore temperature, and, if the predicted bore temperature exceeds the desired threshold bore temperature, adjust the determined power delivery level to lower the predicted bore temperature.

The present invention has been described in terms of the preferred embodiment, and it is recognized that equivalents, alternatives, and modifications, aside from those expressly stated, are possible and within the scope of the appending claims.

What is claimed is:

1. A thermal controller configured to:
   receive operational parameters configured to control an operation of a medical device, wherein the medical device is a magnetic resonance (MR) imaging system;
   predict a thermal output of the medical device prior to the operation from the operational parameters;
   compare the predicted thermal output to a desired limit on thermal output; and
   if the predicted thermal output exceeds the desired limit on thermal output, dynamically control power consumption by a gradient coil of the medical device to maintain an actual thermal output during the operation substantially at or below the desired limit on thermal output during use of the medical device.

2. The thermal controller of claim 1 further configured to control the medical device according to the operational parameters with a reduced power consumption by the medical device if the predicted thermal output exceeds the desired limit on thermal output.

3. The thermal controller of claim 1 further configured to predict the thermal output of the medical device with at least one transfer function.

4. The thermal controller of claim 3 wherein the at least one transfer function includes a linear first order transfer function.

5. The thermal controller of claim 3 further configured to dynamically adjust the at least one transfer function to refine the at least one transfer function for a specific medical device.

6. The thermal controller of claim 1 further configured to predict the thermal output for the medical device from a predicted thermal output of at least one heat-generating component of the medical device.

7. The thermal controller of claim 6 wherein the at least one heat-generating component includes at least one of a gradient coil, an RF shield, and an RF coil.

8. A tangible computer readable storage medium having a computer program stored thereon and representing a set of instructions that, when executed by a computer of a medical magnetic resonance imaging device, causes the computer to:
   receive desired operational constraints for a scan to be performed with the medical imaging device from a user-input;
   determine a potential thermal output of at least one heat-generating component of the medical imaging device from the desired operating constraints and a power to be delivered to the at least one heat-generating component during the scan;
   determine if the potential thermal output will cause an actual thermal output to surpass a desired limit on thermal output during the scan; and
   if the potential thermal output will cause the actual thermal output to surpass the desired limit on thermal output during the scan, adjust the power to be delivered to the at least one heat-generating component during the scan to substantially maintain the actual thermal output at or below the desired limit on thermal output when performing the scan according to the desired operating constraints.

9. The computer readable storage medium of claim 8 wherein the computer is further caused to receive feedback from a temperature sensor configured to indicate at least one of boundary conditions and initial thermal conditions, and wherein the computer is further caused to use the feedback to determine the potential thermal output.

10. The computer readable storage medium of claim 8 wherein the computer is further caused to use at least one transfer function to determine the potential thermal output of the at least one heat-generating component of the medical imaging device.

11. The computer readable storage medium of claim 10 wherein the computer is further caused to sum a result of the at least one transfer function to determine the potential thermal output of the at least one heat-generating component of the medical imaging device.

12. The computer readable storage medium of claim 8 wherein the medical imaging device is an MR imaging system.

13. An MR apparatus comprising:
a plurality of gradient coils positioned about a bore of a magnet to impress a polarizing magnetic field, and an RF transceiver system and an RF switch controlled by a pulse module to transmit RF signals to an RF coil assembly to acquire MR images;
a gradient coil;
an operator console configured to receive operational characteristics of a desired imaging process; and
a computer programmed to:
(A) receive the operational characteristics of an impending MR scan from the operator console;
(B) determine a power delivery level to be delivered to the gradient coil during an execution of the impending MR scan according to the operational characteristics;
(C) predict a thermal output to the bore of the magnet from the operational characteristics and the determined power delivery level, wherein the predicted thermal output is a prediction of what the thermal output will be during an execution of the impending scan at the determined power delivery level;
(D) predict a bore temperature from the predicted thermal output;
(E) compare the predicted bore temperature to a desired threshold bore temperature; and
(F) if the predicted bore temperature exceeds the desired threshold bore temperature, adjust the determined power delivery level to lower the predicted bore temperature such that an actual bore temperature during the execution of the impending MR scan avoids exceeding the desired threshold bore temperature.

14. The MR apparatus of claim 13 wherein the computer is further programmed to repeat (B) through (F) until the predicted bore temperature does not exceed the desired threshold bore temperature.

15. The MR apparatus of claim 13 wherein the computer is further programmed to initiate the impending MR scan according to the operational characteristics at the determined power delivery level unless the predicted bore temperature exceeded the desired threshold bore temperature, and if the predicted bore temperature did exceed the desired threshold bore temperature, then initiate the impending MR scan according to the operational characteristics at the adjusted power delivery level.

16. The MR apparatus of claim 13 wherein the computer is further programmed to notify a user that the determined power delivery level will be adjusted if predicted bore temperature exceeds the desired threshold bore temperature.

17. The MR apparatus of claim 13 wherein the computer is further programmed to predict the thermal output at least from predetermined gain and electrical resistance values of at least one of the plurality of gradient coils, an RF shield, and the RF coil assembly.

18. The MR apparatus of claim 13 further comprising a bore temperature monitoring system including at least one temperature sensor configured to provide feedback indicating boundary conditions of at least one of the plurality of gradient coils, an RF shield, and the RF coil assembly.

19. The MR apparatus of claim 18 wherein the temperature monitoring system is configured to receive the feedback from the at least one temperature sensor and disable scanning if the feedback from the at least one temperature sensor indicates that an actual bore temperature exceeds a thermal limit.

20. An MR apparatus comprising:
a plurality of gradient coils positioned about a bore of a magnet to impress a polarizing magnetic field, and an RF transceiver system and an RF switch controlled by a pulse module to transmit RF signals to an RF coil assembly to acquire MR images;
an operator console configured to receive operational characteristics of a desired imaging process; and
a computer programmed to:
(A) receive the operational characteristics of an impending MR scan from the operator console;
(B) determine a power delivery level to execute the impending MR scan according to the operational characteristics;
(C) predict a thermal output to the bore of the magnet from the operational characteristics and the determined power delivery level, wherein the predicted thermal output is a prediction of what the thermal output will be during an execution of the impending scan at the determined power delivery level;
(D) predict a bore temperature from the predicted thermal output;
(E) compare the predicted bore temperature to a desired threshold bore temperature;
(F) if the predicted bore temperature exceeds the desired threshold bore temperature, adjust the determined power delivery level to lower the predicted bore temperature such that an actual bore temperature during the execution of the impending MR scan avoids exceeding the desired threshold bore temperature; and
(G) if predicted bore temperature exceeds the desired threshold bore temperature, notify a user that the determined power delivery level will be adjusted.

21. An MR apparatus comprising:
a plurality of gradient coils positioned about a bore of a magnet to impress a polarizing magnetic field, and an RF transceiver system and an RF switch controlled by a pulse module to transmit RF signals to an RF coil assembly to acquire MR images;
a bore temperature monitoring system including at least one temperature sensor configured to:
provide feedback indicating boundary conditions of at least one of the plurality of gradient coils, an RF shield, and the RF coil assembly; and
receive the feedback from the at least one temperature sensor and disable scanning if the feedback from the at least one temperature sensor indicates that an actual bore temperature exceeds a thermal limit;
an operator console configured to receive operational characteristics of a desired imaging process; and
a computer programmed to:
(A) receive the operational characteristics of an impending MR scan from the operator console;
(B) determine a power delivery level to execute the impending MR scan according to the operational characteristics;
(C) predict a thermal output to the bore of the magnet from the operational characteristics and the determined power delivery level, wherein the predicted thermal output is a prediction of what the thermal output will be during an execution of the impending scan at the determined power delivery level;

(D) predict a bore temperature from the predicted thermal output;

(E) compare the predicted bore temperature to a desired threshold bore temperature; and (F) if the predicted bore temperature exceeds the desired threshold bore temperature, adjust the determined power delivery level to lower the predicted bore temperature such that an actual bore temperature during the execution of the impending MR scan avoids exceeding the desired threshold bore temperature.

* * * * *